(12) United States Patent
Feeley et al.

(10) Patent No.: US 8,751,860 B2
(45) Date of Patent: Jun. 10, 2014

(54) OBJECT ORIENTED MEMORY IN SOLID STATE DEVICES

(75) Inventors: Peter Feeley, Boise, ID (US); Neal A. Galbo, Boca Raton, FL (US); James Cooke, Boise, ID (US); Victor Y. Tsai, Palo Alto, CA (US); Robert N. Leibowitz, Boise, ID (US); William H. Radke, Los Gatos, CA (US)

(73) Assignee: Micron Technology, Inc., Boise, ID (US)

( * ) Notice: Subject to any disclaimer, the term of this patent is extended or adjusted under 35 U.S.C. 154(b) by 984 days.

(21) Appl. No.: 12/477,349

(22) Filed: Jun. 3, 2009

(65) Prior Publication Data

US 2010/0313065 A1 Dec. 9, 2010

(51) Int. Cl.
*G06F 11/08* (2006.01)
(52) U.S. Cl.
USPC ........... 714/6.21; 714/6.2; 707/687; 707/690; 711/5

(58) Field of Classification Search
USPC ................ 714/15, 6.1, 6.2, 6.21, 6.23; 711/5; 707/687, 690, 691, 692
See application file for complete search history.

(56) References Cited

U.S. PATENT DOCUMENTS

| | | | | |
|---|---|---|---|---|
| 5,274,645 | A * | 12/1993 | Idleman et al. | 714/6.1 |
| 5,623,604 | A * | 4/1997 | Russell et al. | 717/167 |
| 6,240,498 | B1 | 5/2001 | Dickes et al. | |
| 6,298,401 | B1 | 10/2001 | Anderson | |
| 6,490,662 | B1 * | 12/2002 | Pong et al. | 711/152 |
| 6,591,363 | B1 | 7/2003 | von Below | |
| 6,954,875 | B2 * | 10/2005 | Liu | 714/6.1 |
| 7,055,072 | B2 * | 5/2006 | Miyagi | 714/54 |
| 7,179,690 | B2 * | 2/2007 | Lotz et al. | 438/129 |
| 7,328,318 | B1 | 2/2008 | Burriss et al. | |
| 7,506,199 | B2 * | 3/2009 | Ueno | 714/6.24 |
| 8,190,845 | B2 | 5/2012 | Hertzberg et al. | |
| 2002/0041517 | A1 * | 4/2002 | Kim et al. | 365/185.11 |
| 2003/0177209 | A1 * | 9/2003 | Kwok et al. | 709/221 |
| 2005/0010732 | A1 * | 1/2005 | Boyd et al. | 711/162 |
| 2005/0160217 | A1 * | 7/2005 | Gonzalez et al. | 711/6 |

(Continued)

FOREIGN PATENT DOCUMENTS

| | | |
|---|---|---|
| JP | 2001-243632 | 9/2001 |
| JP | 2004-280284 | 10/2004 |

(Continued)

OTHER PUBLICATIONS

International Search Report and Written Opinion, 11 pages, mailed Dec. 30, 2010.

(Continued)

*Primary Examiner* — Joseph Schell
(74) *Attorney, Agent, or Firm* — Brooks, Cameron & Huebsch, PLLC

(57) ABSTRACT

The present disclosure includes methods, devices, and systems for object oriented memory in solid state devices. One embodiment of a method for object oriented memory in solid state devices includes accessing a defined set of data as a single object in an atomic operation manner, where the accessing is from a source other than a host. The embodiment also includes storing the defined set of data as the single object in a number of solid state memory blocks as formatted by a control component of a solid state device that includes the number of solid state memory blocks.

53 Claims, 3 Drawing Sheets

(56) References Cited

U.S. PATENT DOCUMENTS

| | | | |
|---|---|---|---|
| 2006/0090051 A1 | 4/2006 | Speier et al. | |
| 2008/0010502 A1* | 1/2008 | Baek et al. | 714/6 |
| 2008/0123503 A1* | 5/2008 | Achanta et al. | 369/85 |
| 2008/0140963 A1 | 6/2008 | Thomason et al. | |
| 2008/0256420 A1* | 10/2008 | Hafner et al. | 714/770 |
| 2008/0281886 A1 | 11/2008 | Petrank et al. | |
| 2009/0013234 A1 | 1/2009 | Radke | |
| 2009/0113235 A1* | 4/2009 | Selinger | 714/6 |
| 2010/0017649 A1* | 1/2010 | Wu et al. | 714/6 |
| 2010/0106754 A1* | 4/2010 | Condit et al. | 707/822 |

FOREIGN PATENT DOCUMENTS

| | | | |
|---|---|---|---|
| JP | 2006-260283 | A1 | 9/2006 |
| JP | 2007-188384 | | 7/2007 |
| WO | 2007/09472 | | 8/2007 |
| WO | 2009/002725 | A1 | 12/2008 |

OTHER PUBLICATIONS

Anderson, David. "Intelligent Storage: Current Work at Seagate," http://www.dtc.umn.edu/resources/anderson.pdf, accessed Apr. 29, 2009, 17 pgs.

Microsoft. Media Transfer Protocol Enhanced, Revision 0.96, Aug. 31, 2006, 258 pgs.

Copy of Korean Preliminary Rejection for related Korean Application No. 10-2012-7000038, mailed Mar. 13, 2013, (8 pgs.).

Copy of Korean Notice of Final Rejection for related Korean Application No. 10-2012-7000038, dated Sep. 26, 2013, 3 pages.

Notice of Rejection for related Japanese Patent Application No. 2012-513923, mailed May 28, 2013, (3 pgs.).

Copy of First Rejection from Chinese patent application No. 201080024329.1, dated Nov. 18, 2013, 20 pp.

Oki, Toshikazu, "Oracle, SQL Server, DB2, MySQL: Tuning Point Best 10," DB Magazine, vol. 16, No. 5, Japan, Shoeisha. Co., Ltd., Sep. 1, 2006, pp. 052-062.

Ojima, Ryoji, ".Net Development Paradise No. 2," Web+DB Press, vol. 33, Japan, Gijutsu-Hyohron Co., Ltd., Jul. 25, 2006, pp. 186-196.

Hyakuta, Shoma, "Make a Brave Try with SQL Server!; Surely Useful Know-How at the Site," Windows Developer Magazine, vol. 12, No. 4, Japan, Shoeisha. Co., Ltd., Mar. 1, 2006, pp. 144-149.

Copy of Office Action for related Japanese Patent Application No. 2012-513923, dated Oct. 1, 2013, 3 pages.

Copy of EP Search Report for related EP Patent Application No. 10783692.6, dated Oct. 15, 2013, 4 pages.

* cited by examiner

OBJECT ORIENTED MEMORY IN SOLID STATE DEVICES

TECHNICAL FIELD

The present disclosure relates generally to semiconductor memory devices, methods, and systems, and more particularly, to object oriented memory in solid state devices.

BACKGROUND

Memory devices may be provided as internal, semiconductor, integrated circuits and/or external removable devices, for instance, in computers, personal digital assistants (PDAs), digital cameras, and mobile (e.g., cellular) telephones, among various other electronic devices. There are many different types of memory including random access memory (RAM), read-only memory (ROM), dynamic random access memory (DRAM), synchronous dynamic random access memory (SDRAM), phase change random access memory (PCRAM), and flash memory, among other types of memory configurations.

Various types of memory may be used in systems using memory devices. The various types of memory may be used in any combination to provide memory for a host. For instance, flash memory (e.g., using NAND or NOR memory cells) may be included in a memory device. Flash memory may be utilized as internal memory or as removable memory, which may be coupled to the system through an interface, such as a universal serial bus (USB) connection.

Flash memory devices may be utilized as non-volatile memory for a wide range of electronic applications. Flash memory devices may use a one-transistor memory cell that allows for high memory densities, high reliability, and low power consumption.

DETAILED DESCRIPTION

Figure 1:
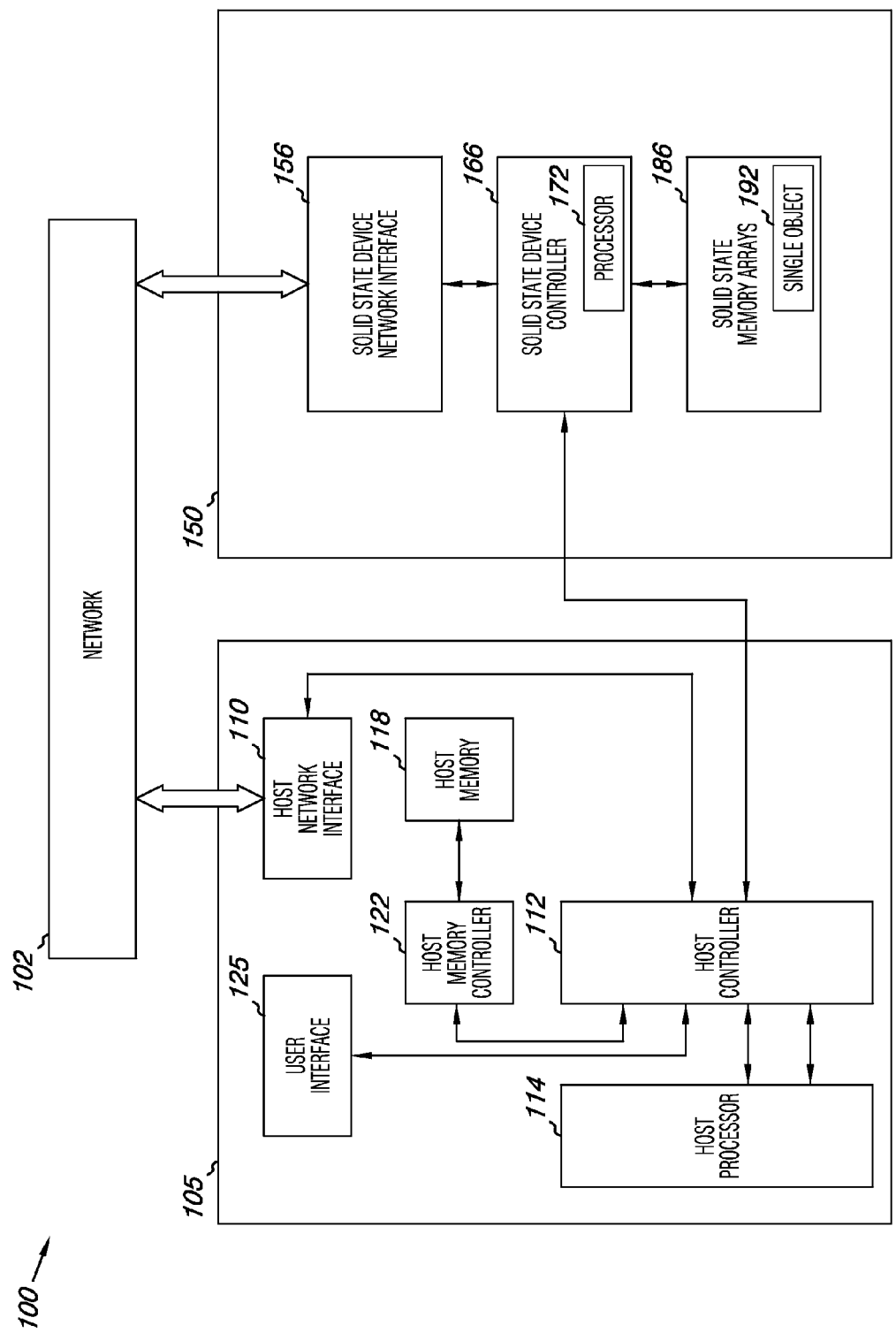
FIG. 1 illustrates a block diagram of a system in accordance with one or more embodiments of the present disclosure.

The present disclosure includes methods, devices, and systems for object oriented memory in solid state devices. One embodiment of a method for object oriented memory in solid state devices includes accessing a defined set of data as a single object in an atomic operation manner, where the accessing is from a source other than a host. In various embodiments, the source can be, by way of illustration and not by way of limitation, a network as described with regard to FIG. 1. The embodiment also includes storing the defined set of data as the single object in a number of solid state memory blocks as formatted by a control component of a solid state device that includes the number of solid state memory blocks.

A solid state device can include a number of memory devices (e.g., a number of memory chips). As utilized in the present disclosure, using "a number of" to refer to a thing can refer to one or more such things. For instance, a number of memory devices can refer to one or more memory devices. As one of ordinary skill in the art will appreciate, a memory chip can include a number of dies. Each die can include a number of memory arrays and peripheral circuitry thereon. A memory array can include a number of planes, with each plane including a number of physical blocks of memory cells. Each physical block can include a number of pages of memory cells that can store a number of sectors of data.

In order to achieve low latency and high bandwidth operations across large storage capacity, solid state devices may include multiple channels operating in parallel, with each channel operating some portion of memory. Thus, multiple copies of a memory channel controller (e.g., NAND flash controller logic) may be integrated on a solid state device's multi-channel system controller. In such an arrangement, each channel, or an aggregation point of the channels, may be tasked with operating the associated memory served by the channel, including performing logical to physical mapping and/or block management (e.g., wear leveling). Therefore, each copy of the multiple memory channel controllers, corresponding to each of the multiple channels, may have high speed buffer memory used to carry out the mapping and block management functions. In addition, each copy of the multiple memory channel controllers may include buffer memory for "in-flight" data directed to a respective channel.

Memory devices may be combined together to form a solid state device. A solid state device may include non-volatile memory (e.g., NAND flash memory and/or NOR flash memory) and/or may include volatile memory (e.g., DRAM and/or SRAM), among various other types of non-volatile and volatile memory.

A solid state device may be used to replace hard disk drives as the main memory device for a computer, as the solid state device may have advantages over hard drives in terms of performance, size, weight, ruggedness, operating temperature range, and/or power consumption. For example, solid state devices may have superior performance when compared to magnetic disk drives due to their lack of moving parts, which may ameliorate seek time, latency, and/or other electro-mechanical delays associated with magnetic disk drives. Solid state device manufacturers may use non-volatile flash memory to create flash solid state devices that may not use an internal battery supply, thus allowing the drive to be more versatile and compact.

For some memory applications, solid state devices may be used as a replacement or complement to hard disk drives. In these instances, solid state devices may be placed in an environment designed to accommodate a hard drive's functions. Due to the differences in granularity or quantization of the smallest erasable unit between solid state devices and hard drives (e.g., a 512 byte sector for hard drives versus a 128 k or 256 k block in solid state devices), a solid state device that is used as a replacement for or complement to a hard drive in a computing device may not operate at peak performance levels.

Parallel communications between each copy of the multiple memory channel controllers and the corresponding portions of memory may require approximately 20 pins to establish data, control, power, and ground connections therebetween. This can result in an expensive memory system having a large pin count to ensure compatibility with existing disk drive protocols.

Development and adoption of solid state devices has been driven by a rapidly expanding need for higher input/output performance. High performance desktop computers, laptops, mobile systems or devices, and/or any application that needs to deliver information in real-time or near real-time can benefit from solid state devices. Historically, solid state devices have been more expensive than hard drives. Due to improvements in manufacturing technology and expanded chip capacity, however, prices have dropped, leading both consumers and enterprise-level customers to re-evaluate solid state devices as viable alternatives to previous memory systems.

A memory cell stores digital information in a structure that can be rapidly switched between more than one readily discernable states. Some memory cells are based on the presence or absence of electrical charge contained in a region of the cell. By retaining its charge, the memory cell retains its stored data. Some memory cell structures inherently leak charge, and must be continually powered to refresh the stored charge.

Non-volatile memory, however, does not require electrical power to retain charge information. For instance, flash memory may have a "floating gate" upon which the charge is stored, which is insulated to minimize charge leakage. Thus, power is required only to change the stored information (e.g., data, bits, etc.), for instance, to write to (e.g., store charge), to read from (e.g., determine if charge is present), and/or to erase (e.g., remove charge) a memory cell. The non-volatility of stored data in flash memory is advantageous in portable electronic applications. Non-volatile memory may be used in, by way of example and not by way of limitation, personal computers (e.g., desktop and laptop), personal digital assistants (PDAs), digital cameras, and cellular telephones, among many other uses. Program code and system data, such as a basic input/output system (BIOS) used in computing systems, among other types, may be stored in non-volatile memory devices.

A solid-state memory device may be a memory device that stores persistent data on solid-state flash memory. Solid state memory devices are not hard drives, in the traditional sense of the term, because there are no moving parts involved instead, a solid-state memory device has an array of semiconductor memory organized using integrated circuits (ICs) rather than magnetic or optical media.

This arrangement has many advantages. Data transfer to and from solid state devices is faster than electromechanical disk drives. Seek time and latency may also be reduced. Users enjoy much faster boot times and/or functionality of operating systems as well. In general, solid state devices are also more durable and quieter, with no moving parts to break or spin up or down. Solid state devices do, however, have a set life expectancy because there is a finite number of erase/write cycles before performance may become erratic.

Hence, a defined set of data may be rewritten periodically due, for instance, to "wear" on the memory cells to which the defined set of data was previously stored. In various embodiments as described in the present disclosure, a defined set of data can include a complete, integrated package of "critical data" that can include instructions to enable proper system performance, as defined prior to and during access of such data and/or after storage of such data. In some embodiments, the "set" of data can be defined as multiple packages of data that become integrated during and/or after accessing such data but prior to storing the complete, integrated package as the defined set of data.

Moreover, advancements in technology may make replacing of previously stored (e.g., written) sets of defined data desirable. In the present disclosure, each of these operations can be termed "updating" the defined set of data. Especially for critical data (e.g., for boot images and/or operating systems upon which operability of a system depends upon a substantially error-free read thereof), it can be important to validate the accuracy of such data before storing the defined set of data to the solid state memory, in particular when the newly accessed data replaces data relied upon by a host (e.g., a host device and/or a system that is managed by the host device) for proper operability.

Existing solid state memory (e.g., NOR and/or NAND flash memory) in solid state devices may store, for instance, host data (e.g., a file) as a series of fixed length logical blocks. The host may maintain a table that not only identifies which logical blocks within the flash memory device are associated with each file but also the ordering of those logical blocks to create the file. Read and write access to the memory device by the host may be performed using the logical block numbers. However, the flash device may lack enough information to understand how the reads and writes relate to the underlying file data itself.

Despite this, the memory system may work well enough for many types of host data but may have particular deficiencies for some data types. One example is system data such as processor boot instructions and/or operating system instructions crucial to operability of a system that has functions dependent on substantially error-free reading of coded instructions. Corruption of this type of data may render such a system inoperable. An alternative memory mechanism is described in the present disclosure that provides for increased reliability and performance, along with a broader range of services. As described in the present disclosure, the alternative memory mechanism can utilize object oriented memory in solid state devices and/or block oriented memory that is governed by an encoded set of rules to mimic object oriented memory, for example.

Rather than treating a file as a series of logical blocks (e.g., in a block oriented manner), the defined set of data in a file can instead be treated (e.g., accessed and/or stored) as one single object (e.g., a complete, integrated package) by a solid state memory device. Treating the defined set of data as a single object can allow the solid state memory device (e.g., having a number of non-volatile NOR and/or NAND flash memory arrays) to perform certain operations during write and read processes that can increase reliability and performance. Examples of such operations, which can be performed on data upon which a substantially error-free read is required for operability of particular system functions, can include: a read-verify where a type of data integrity check is performed before the write process is performed or considered complete; multiple copies of such data are stored so that, in case of a read failure with one copy, the system can rely on a read of another one of the copies; and a previous known-good version of the data is maintained so that, in case of a faulty read or re-write, the system can be directed to a read of the last known-good data; among other operations described herein.

Object oriented data structures in a solid state device, as described in the present disclosure, can provide and/or assist in providing the just-described operations, whereas traditional block oriented memory devices may be incapable of such operations. As described in the present disclosure, a solid state device can include a number of solid state memory arrays and a solid state device controller, among other components. The controller can be a control component that manages (e.g., directs, controls, regulates, etc.) the solid state device using instructions (e.g., executed by a processor where appropriate) stored as software, firmware, and/or hardware (e.g., logic such as an application specific circuit (ASIC)). The present disclosure will enable one of ordinary skill in the art to practice these operations, among others, with embodiments for object oriented memory in solid state devices, also referred to herein as "object oriented solid state devices".

When writing as object oriented memory in solid state devices, a solid state device can access a data stream in a block oriented device manner. However, because the object oriented memory device can access the data stream with an understanding that the data stream is associated with a single defined entity (e.g., a defined set of data that defines a single object), a write completion acknowledgement response to, for example, a host can be delayed until one or more data protection operations have been successfully completed. Performance of a variety of data protection operations can be facilitated through use of object oriented memory techniques. A number of these data protection operations are described below.

The solid state device can use properties associated with the object to improve the reliability of the object data read by the host. The solid state device can use multiple copies to reduce likelihood that a media error would corrupt the object as read by the host. A variety of operations can be performed individually or in combination to enable such a reduction in likelihood, as described in more detail below. For example, a fail-over operation can use another copy of the object in a case where error detection indicates a read and/or write failure. In some embodiments, a bit-by-bit comparison can be performed on multiple copies of the object after error detection in at least one of the copies. Discrepancies found in the comparison can result in a majority vote of the multiple copies or the solid state device can revert to the last known-good object. Another level of validation can be a complete cyclic redundancy check (CRC) of the entire object.

The object oriented solid state device can direct the host to previously stored versions of the entire object. For example, a control component of the object oriented solid state device can detect multiple read requests to the object within a particular period of time (e.g., which can be a predetermined period or determined "on the fly", as appropriate to the circumstance) and recognize such multiple requests as an indicator that the device is caught in a re-boot loop. Such recognition can result in the solid state device providing the host with a last known-good version of the object.

The object oriented solid state device can, in various embodiments, provide services to expedite booting of the host. Among these services, the solid state device can automatically initiate a read operation based upon a particular event, such as a power-on reset and/or transition of a signal, among other events. The read data can then be automatically sent to the host where it can be used, for example, to boot the host and/or the system that includes the host or the data can be ignored if the data is not required by the host and/or the system that includes the host at that time.

Block oriented memory devices may not be able to perform the range of operations and/or services described herein because block oriented memory devices generally do not have a capability to be aware of the number of logical blocks in a file and/or the order in which the blocks will be read and/or written. Block oriented memory devices generally only respond to read/write commands.

Before a computing device accomplishes a desired task, it may receive an appropriate set of instructions. Executed by, for instance, a device's processor(s), these instructions direct the operation of the device. These instructions can be stored in a memory. Instructions can invoke other instructions. A computing device and/or system (e.g., a server, router, desktop computer, laptop, mobile devices or systems, and other devices having processor logic and memory) can include an operating system layer and an application layer to enable performing various functions or roles. The operating system layer may include a "kernel" (i.e., master control program) that provides an underlying level of control and operability. The kernel may provide task management, device management, and data management, among others, to, for instance, a host. The kernel may set the standards for application programs that run on the computing device and may control resources used by application programs. The application layer may include programs (i.e., executable instructions) which are located above the operating system layer and accessible by a user.

A boot image and/or operating system instructions may contain encoded information (e.g., a defined set of bits) that enables initiation of the just-described functions and thus can be called critical data. Accessing and/or storing such critical data in an object oriented manner should assist in preserving the integrity of the critical data in order to maintain operability of systems controlled, for example, by a host.

As described in the present disclosure, instructions are provided that execute to protect critical data. One or more embodiments are provided that execute instructions such that after a new defined set of data has booted successfully as stored at least once, whether in association with an operating system installation or update, the new defined set of data is automatically saved as "last install". The last install configuration will be a "known good" installation and help to avoid issues when, for example, a user inadvertently creates a non-bootable kernel configuration and has not created a backup. One or more embodiments are provided that execute instructions to make a number of copies of one or more defined sets of critical data. One or more embodiments are provided that execute instructions that can execute to apply error correction operation to the copy. These and other embodiments will be appreciated by one of ordinary skill in the art upon reading this disclosure.

FIG. 1 illustrates a block diagram of a system in accordance with one or more embodiments of the present disclosure. In the following detailed description, reference is made to the accompanying drawings that form a part hereof and in which is shown by way of illustration how one or more embodiments of the disclosure may be practiced. These embodiments are described in sufficient detail to enable those of ordinary skill in the art to practice the embodiments of this disclosure, and it is to be understood that other embodiments may be utilized and that process, electrical, and/or structural changes may be made without departing from the scope of the present disclosure. As used herein, the designators "N," "M," "R," and "S," particularly with respect to reference numerals in the drawings, indicates that a number of the particular feature so designated can be included with one or more embodiments of the present disclosure.

The figures herein follow a numbering convention in which the first digit or digits correspond to the drawing figure number and the remaining digits identify an element or component in the drawing. Similar elements or components between different figures may be identified by the use of similar digits. For example, 130 may reference element "30" in FIG. 1, and a similar element may be referenced as 230 in FIG. 2. As will be appreciated, elements shown in the various embodiments herein can be added, exchanged, and/or eliminated so as to provide a number of additional embodiments of the present disclosure. In addition, as will be appreciated, the proportion and the relative scale of the elements provided in the figures are intended to illustrate the embodiments of the present invention, and should not be taken in a limiting sense.

A system may include a host, host memory, and a number of memory devices external to the host. The host may have a number of processors, a host controller, and a host controller memory that is associated with the host controller, and a number of internal memory devices. The host may use the internal and/or the external memory devices by interacting with the memory devices via the host controller. The host controller may communicate with the memory devices to perform operations on the memory devices, such as reading data from the memory devices to the host or storing data from the host in the memory devices. The commands that manage the reading and storing of data may be built by the host. The host controller may have hardware that controls the memory device capabilities in the commands. In such cases, when the host controller has hardware that defines the memory devices capabilities, the host controller may be limited to building commands that have the capabilities associated with the hardware that is on the host controller.

In one or more embodiments, the system 100 illustrated in FIG. 1 can be utilized to enable functionality, by way of example and not by way of limitation, for personal computers and/or a laptop computers, mobile telephones, digital cameras, digital recording and play back devices, PDAs, memory card readers, and interface hubs, and USBs, among other examples.

The system 100 can include a host 105, where the host 105 includes at least one host processor 114 that communicates with a number of other components via a host controller 112. The other host components may include a host memory 118 accessed via a host memory controller 122. Additional components may include a host network interface 110 and a user interface 125.

In various embodiments, the host network interface 110 can allow accessing (e.g., communication with) an outside network 102 to enable input and output device interaction with the network 102. By way of example and not by way of limitation, such outside networks can include a local area network (LAN), a wide area network (WAN), the Internet, and/or wireless networks, among others. The host network interface 110 may be coupled via the network 102 to corresponding interface devices in other devices and/or systems. Network 102 may itself be comprised of many interconnected systems and communication links, as the same are known and understood by one of ordinary skill in the art. Communication links as used herein may be hardwire links, optical links, satellite or other wireless communications links, wave propagation links, or any other mechanisms for communication of information.

The user interface 125 can, in various embodiments, enable input by a number of devices that may include a keyboard, pointing devices (e.g., a mouse, trackball, touchpad, or graphics tablet), a scanner, a touchscreen incorporated into a display, audio input devices such as voice recognition systems, microphones, and/or other types of input devices (not shown). In general, use of the term "input device" is intended to include all possible types of devices and ways to input information into the system 100 illustrated in FIG. 1.

The host 105 of the system 100 can, in various embodiments, be operably coupled to a solid state device 150 that provides peripheral memory to the host 105. The solid state device can, in various embodiments, include a solid state device network interface 156 that can allow communication with (e.g., access to) the outside network 102 to enable input and/or output to the network 102, as previously described.

The solid state device network interface 156 can, in various embodiments, be operably coupled to a solid state device controller 166. The solid state device controller 166 can, in various embodiments, handle and/or manage input of data/information from and/or output of data/information to the solid state device network interface 156. Managing the data/information by the solid state device controller 166 may be executed by a processor 172 embedded in, or otherwise associated with, the solid state device controller 166. The solid state device controller 166 can, in various embodiments, be operably coupled to the host controller 112 of the host 105 in order to provide to and/or receive from (e.g., exchange) the host 105 data/information. For example, the data/information (e.g., bits that are encoded in a computer-readable binary code) can be data/information upon which operability of a system controlled by the host 105 depends upon a substantially error-free read of such data/information. By way of example and not by way of limitation, the data/information can be a defined set of data required for booting (e.g., a boot image) and/or initiating functionality of an operating system in a host and/or a system managed by the host.

The solid state device controller 166 of the solid state device 150 can, in various embodiments, be operably coupled to a number of solid state memory arrays 186. The solid state memory arrays 186 are described in further detail in connection with FIG. 2. In brief one or more solid state memory arrays 186 can, in various embodiments, be utilized to store, for example, the defined set of data (e.g., after "writing" of such data in memory cells of the memory arrays) as a single object 192 upon which operability of the system controlled by the host 105 depends upon a substantially error-free read of the defined set of data.

As described in the present disclosure, the defined set of data can be handled as a collective whole to be stored in the solid state memory arrays 186 as one or more single objects 192 and can be provided as such to the host 105 through the solid state device controller 166 to reliably enable booting and/or operating system functions in the system managed (e.g., directed, controlled, regulated, etc.) by the host 105. As described in the present disclosure, the components 156, 166, 172, 186, 192 of the solid state device 150 can, in various embodiments, enable reliable updating of such defined sets of data (e.g., single objects), which may be referred to as "critical data", by handling such single objects in an object oriented manner.

Figure 2:
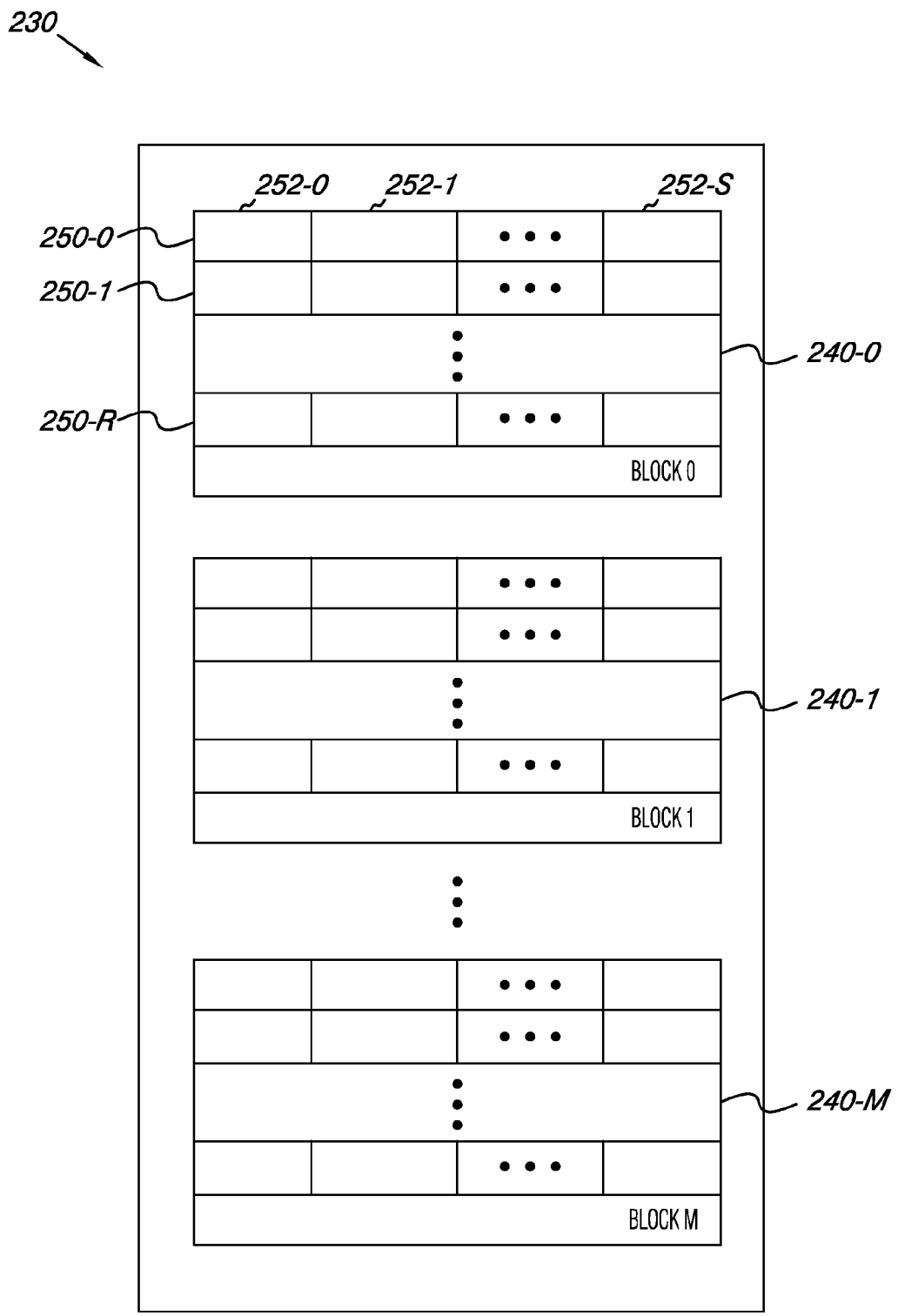
FIG. 2 illustrates a diagram of a portion of a memory array in accordance with one or more embodiments of the present disclosure.

FIG. 2 illustrates a diagram of a portion of a memory array in accordance with one or more embodiments of the present disclosure. Although not shown in FIG. 2, one of ordinary skill in the art will appreciate that the solid state memory array 230 can be located on a particular semiconductor die along with various peripheral circuitry associated with the operation thereof.

As shown in FIG. 2, solid state memory array 230 has a number of physical blocks 240-0 (BLOCK 0), 240-1 (BLOCK 1), . . . , 240-M (BLOCK M) of memory cells. The indicator "M" is used to indicate that the array 230 can include a number of physical blocks. The memory cells can be single level cells and/or multilevel cells. In various embodiments of the present disclosure, particular physical memory blocks can include only single level memory cells (e.g., single-bit memory cells) or the physical memory blocks can include multilevel memory cells that are only written as single-bit cells. As an example, the number of physical blocks in array 230 may be 128 blocks, 512 blocks, or 1,024 blocks, but embodiments are not limited to a particular multiple of 128 or to any particular number of physical blocks in an array 230.

Further, embodiments are not limited to a particular type of memory being used in all of a number of arrays. That is, different memory arrays can, in various embodiments, use any type of memory blocks as presently known by one of ordinary skill in the art (e.g., various types of memory such as non-volatile, volatile, etc.) However, for purposes of the present disclosure, the number of memory arrays contains at least one array that is configured as a solid state memory array, as appreciated by one of ordinary skill in the art. In the embodiment illustrated in FIG. 2, the memory array 230 can be, for example, a non-volatile NAND flash memory array. In some embodiments, by way of example and not by way of limitation, the memory array 230 can have a non-volatile NOR flash memory array architecture.

In the example shown in FIG. 2, each physical block 240-0, 240-1, . . . , 240-M includes memory cells which can be erased together as a unit (e.g., the cells in each physical block can be erased in a substantially simultaneous manner). For instance, the cells in each physical block can be erased together in a single operation. Each physical block, e.g., 240-0, 240-1, . . . , 240-M, contains a number of physical rows, e.g., 250-0, 250-1, . . . , 250-R, of memory cells coupled to an access line (e.g., a word line). The indicator "R" is used to indicate that a physical block, e.g., 240-0, 240-1, . . . , 240-M, can include a number of rows. In some embodiments, the number of rows (e.g., word lines) in each physical block can be 32, but embodiments are not limited to a particular number of rows 250-0, 250-1, . . . , 250-R per physical block.

As one of ordinary skill in the art will appreciate, each row 250-0, 250-1, . . . , 250-R can store one or more pages (e.g., bits) of data. A page refers to a unit of programming and/or reading (e.g., a number of cells that are programmed and/or read together or as a functional group of memory cells). In the embodiment shown in FIG. 2, each row 250-0, 250-1, . . . , 250-R stores one page of data. However, embodiments of the present disclosure are not so limited. For instance, in some embodiments of the present disclosure, each row can store multiple pages of data. For example, each cell in a row can contribute a bit towards an upper page of data, and can contribute a bit towards a lower page of data. In one or more embodiments, a memory array can include multiple physical blocks of memory cells and each physical block can be organized into multiple pages. As described in the present disclosure, at least one array and/or multiple blocks in such an array includes memory cells that can only store one page of data or that are utilized in such a manner that they store only one page of data.

In one or more embodiments of the present disclosure, and as shown in FIG. 2, a row, such as row 250-0, can store data (e.g., after a write operation) in accordance with a number of physical sectors 252-0, 252-1, . . . , 252-S. The indicator "S" is used to indicate that a row, e.g., 250-0, 250-1, . . . , 250-R, can include a number of physical sectors. Each physical sector 252-0, 252-1, . . . , 252-S can store data corresponding to a logical sector and can include overhead information, such as error correction code (FCC) information and logical block address (LBA) information, as well as a defined set of data (e.g., critical data as described in the present disclosure). As one of ordinary skill in the art will appreciate, logical block addressing is a scheme often used by a host for identifying a logical sector of information. As an example, a logical sector of data can be a number of bytes of data (e.g., 256 bytes, 512 bytes, or 1,024 bytes). Embodiments are not limited to these examples.

It is noted that other configurations for the physical blocks 240-0, 240-1, . . . , 240-M, rows 250-0, 250-1, . . . , 250-R, sectors 252-0, 252-1, . . . , 252-S, and pages are possible. For example, the rows 250-0, 250-1, . . . , 250-R of the physical blocks 240-0, 240-1, . . . , 240-M can each store data corresponding to a single logical sector which can include, for example, more or less than 512 bytes of data.

Consistent with descriptions thereof provided in the present disclosure, a solid state device can, in various embodiments, include a control component coupled to a number of solid state memory arrays in the solid state device, where each array has multiple physical blocks of memory cells. Additionally, in various embodiments, each array can be formatted by the control component of the solid state device that is configured to access a defined set of data as a single object and store the defined set of data in the number of arrays as the single object.

As used herein, when it is stated that a solid state control component can perform an action, it will be understood as an abbreviated substitute for "the control component that is configured to" or "the control component that is configured to execute by way of a processor".

In some embodiments, the control component of the solid state device can include an associated processor that manages the formatting of the single object. The formatting can be performed by determining in which of the multiple physical blocks of memory cells in the number of solid state memory arrays the defined set of data will be stored. For example, the control component of the solid state device can, in various embodiments, store the defined set of data to a particular (e.g., which can be a predetermined or determined "on the fly", as appropriate to the circumstance) partition of the number of memory arrays of the physical blocks of memory cells. The particular partition can be determined based upon a number of factors, as described in the present disclosure. Such factors can, by way of example and not by way of limitation, include the wear (e.g., the number of write/erase cycles particular memory arrays/blocks/cells have experienced), whether the cells of a particular block/array are single-level or multi-level memory cells, and/or the type of memory cell in the block/array, among other factors.

By way of example and not by way of limitation, the multiple physical blocks of memory cells can be arranged in a non-volatile NAND or a non-volatile NOR architecture. In some embodiments, the control component of the solid state device can store the defined set of data beginning-to-end in a number of contiguous physical blocks of memory cells. For example, the contiguous physical blocks of memory cells can be defined by the particular partition of the number of memory arrays of the physical blocks of memory cells. In some embodiments, the defined set of data can be a boot image, as described herein. In some embodiments, the defined set of data can be instructions for installing and/or initiating a number of operating systems, as described herein. The embodiments of defined sets of data are not so limited.

The control component of the solid state device can, in some embodiments, access the defined set of data and store the defined set of data in the number of arrays after completion of an atomic operation. As appreciated by one of ordinary skill in the relevant art, a set of operations can be considered atomic when two conditions are met. First, until the entire set of operations is completed, no other process can know about the changes being made undetectably. Second, if any of the operations are unsuccessful, then the entire set of operations is aborted and the state of the system is restored to the state it was in before any of the operations began. In the present disclosure, accessing the defined set of data in an atomic operation manner can, for example, prevent an access being terminated and/or interrupted prematurely, which otherwise may result in a partial update and/or installation of the defined set of data. If not for the atomic operation, a number of negative consequences could occur due to a partial write of critical data. Additionally, the control component of the solid state device can, in some embodiments, assign a pointer to a last known-good copy of the data in the arrays until completion of the atomic operation, where the pointer directs a read of the data to be performed on the last known-good copy. A pointer to a last known-good object can be provided and maintained. That is, until a write process has been completed successfully, any read attempt of the object can be directed by the pointer to the last known-good object.

Additionally, a solid state device can, in various embodiments, include a control component coupled to a number of solid state memory arrays in the solid state device, where each array has multiple physical blocks of memory cells. Each array can, in various embodiments, be formatted by the control component of the solid state device that is configured to access a defined set of data as a single object, where one or more iterations of the defined set of data are accessed, and store multiple copies of the one or more iterations to particular locations in the number of arrays as the single object. Accessing one or more iterations of the defined set of data can, by way of example and not by way of limitation, include downloading one or more copies of program instructions from a network provider of such instructions and/or from a host, as described in the present disclosure.

The control component of the solid state device can, in some embodiments, store each of the multiple copies in a physically different array of the number of arrays. By storing in the physically different array, faults confined to a certain array may be prevented from corrupting critical data stored in the physically different array. However, in some embodiments, possibly for reduction of space and/or cost, among other considerations, the number of arrays can be one. As previously described, the control component of the solid state device can, in some embodiments, read the single object beginning-to-end in a number of contiguous physical blocks of memory cells.

Multiple copies of the write object can be stored (e.g., simultaneously or sequentially). In the case of a flash memory device, the copies can be stored in physically independent memory arrays to contribute to overall reliability. In various embodiments, the object can be stored in memory elements that have been determined to be most reliable within and/or between various arrays of memory cells. For example, the data can be stored in elements that are currently and/or are capable of storing one bit per memory cell rather than two or more.

The control component of the solid state device can, in some embodiments, store at least one of the multiple copies in physical blocks of the array determined to be more reliable than other physical blocks. For example, the physical blocks of the array determined to be more reliable can be physical blocks having single-level memory cells. Such single-level memory cells can be capable of holding only one bit of data or they can be multi-level memory cells restrained from holding more than one bit of data. In any case, a cell having only one bit of data can be more reliable due to less likelihood of a notable shift in charge level affecting a read of the cell. In some embodiments, the physical blocks of the array determined to be more reliable can be physical blocks having memory cells that have been reused fewer times than memory cells of the other physical blocks (e.g., memory blocks/cells that have experienced fewer write/erase cycles). The manner of determining greater reliability of physical blocks of the array is not limited by the examples just provided.

After the one or more iterations of the accessed data are accessed, in some embodiments, the control component of the solid state device can independently verify multiple copies of the one or more data iterations prior to storing the single object in the array. To independently verify can be performed as operations described in the present application. As such, the control component of the solid state device can, in some embodiments, read and independently correct a number of errors found prior to storing the single object in the array. After completion of verifying the data iterations, the control component of the solid state device can assign a pointer to a particular copy of the one or more data iterations as a new last known-good copy to replace a previous last known-good copy. The control component of the solid state device also can send a write completion acknowledgment to a host such that any read by the host is directed by the pointer to the new last known-good copy.

After an entire object has been received, each of the copies can be independently verified. Verification can include at least reading and error correcting the entire object. Moreover, thresholds can be implemented by which fewer than a particular number of read errors are detected before storing of an object in a solid state memory array is allowed.

In addition, an end-to-end data integrity check (e.g., a cyclic redundancy check (CRC)) can be calculated. In some embodiments, the CRC can be embedded by the host before transmission to the solid state memory device. In brief, a CRC operation uses a mathematical calculation to verify data integrity after a transfer operation. A CRC is a type of function that takes as input a data stream of any length, and produces as output a value of a certain space, commonly a 32-bit integer. The term CRC denotes either the function or the function's output. A CRC can be used as a checksum to detect accidental alteration of data during transmission or storage. CRCs are popular because they are simple to implement in binary hardware, are easy to analyze mathematically, and are particularly good at detecting common errors, for instance, caused by noise in transmission channels.

Consistent with descriptions thereof provided in the present disclosure, a system can, in various embodiments, include a host control component that is configured to be operably coupled to a host in order to manage a system. Such a host, by way of example and not by way of limitation, can include maintaining intended operability of computing devices and systems, portable or otherwise, as described herein. The host control component can be configured to be operably coupled to a control component of a solid state device having multiple solid state physical memory blocks of memory cells. Additionally, the control component of the solid state device can be configured to access a defined set of data as a single object and manage the defined set of data as the single object during subsequent write and read operations.

The control component of the solid state device can, in some embodiments, store multiple copies of the single object where each of the multiple copies is separately stored in the multiple memory blocks as determined by a set of rules for writing to physically separate memory blocks. For example, the control component of the solid state device can, according to the set of rules, store the multiple copies of the single object in a particular partition of the multiple physical memory blocks of memory cells. As such, the control component of the solid state device can, in some embodiments, store each of the multiple copies of the single object in the particular partition contiguously in a number of the multiple physical memory blocks for end-to-end data integrity.

In addition or in the alternative, the control component of the solid state device can, in some embodiments, write in the multiple physical memory blocks as determined by logical block addressing. As such, the control component of the solid state device can, in some embodiments, store in particular logical block addresses.

As previously stated, block oriented memory devices may not be able to perform the range of operations and/or services described herein with regard to object oriented memory systems because block oriented memory devices generally do not have a capability to be aware of the number of logical blocks in a file and/or the order in which the blocks will be read and/or written. Block oriented memory devices generally only respond to read/write commands. Nonetheless, as described in the present disclosure, when both the host and the solid state device follow a set of rules associated with block reads and writes to particular logical block addresses, a number of the operations and/or services described herein with regard to object oriented solid state devices can be emulated. Such emulation can be accomplished when block oriented solid state devices handle data in a prescribed manner.

For example, the block oriented device can define a series of block numbers to be reserved for the data. The data can be stored in the particular series in a particular order, with the host providing an indicator to the solid state device of the last block of data. The solid state device can manage multiple copies of the data as well as provide read access to the last known-good version of the data when required. Storing the data as such in a block oriented arrangement would allow reading of a defined set of data to be performed consecutively from beginning-to-end as with an object oriented solid state device.

Hence, a system as described in the present disclosure can, in various embodiments, include a host control component that is configured to be operably coupled to a host in order to manage a system, as described herein. The host control component can, in various embodiments, be configured to be operably coupled to a control component of a solid state device having multiple solid state physical memory blocks of memory cells. The control component of the solid state device can be configured to access a defined set of data in a block oriented manner and handle the defined set of data in the block oriented manner during subsequent write and read operations when a set of rules is followed by the host control component and the solid state device control component to store the defined set of data in particular logical block addresses.

The set of rules followed by the host control component and the solid state device control component can, in various embodiments, allow a write of the defined set of data in separate and non-partitioned physical memory blocks in the multiple solid state device physical memory blocks (e.g., consistent with block oriented memory). However, the set of rules followed by the host control component and the solid state device control component can, in various embodiments, include a particular series of physical memory block numbers to store the defined set of data. Such rules can direct that the write of the defined set of data is performed in a particular order. Such rules also can direct that the host control component provides an indicator to the solid state device control component to identify a last block of the defined set of data. By following one or more of such rules, the solid state device control component can read the defined set of data consecutively from a beginning to an end of the defined set of data as if the defined set of data was stored in an object oriented manner.

In some embodiments, the solid state device control component can store multiple copies of the defined set of data where each of the multiple copies is separately stored to the multiple memory blocks as determined by the set of rules. Additionally, the solid state device control component can, in some embodiments, manage the multiple copies of the defined set of data to provide read access of the host control component to a last known-good copy of the defined set of data.

Figure 3:
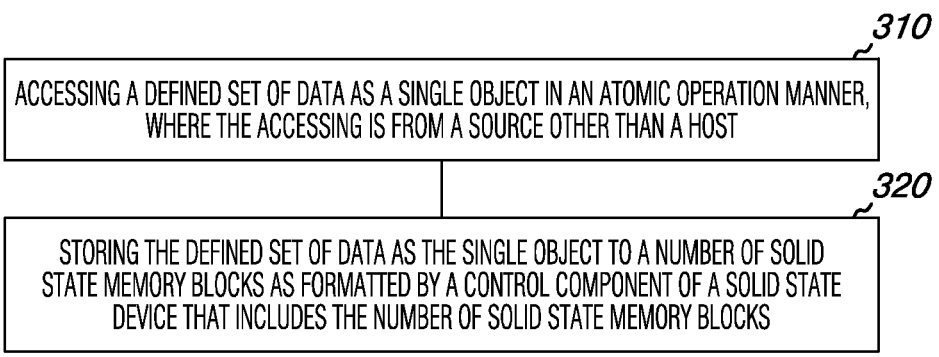
FIG. 3 is a block diagram illustrating object oriented memory in solid state devices in accordance with one or more method embodiments of the present disclosure.

FIG. 3 is a block diagram illustrating object oriented memory in solid state devices in accordance with one or more method embodiments of the present disclosure. Unless explicitly stated, the embodiments described herein are not constrained to a particular order or sequence. Additionally, some of the described embodiments, or elements thereof, can occur or be operated at the same, or at least substantially the same, point in time.

The embodiment illustrated in FIG. 3 includes accessing a defined set of data as a single object in an atomic operation manner, where the accessing is from a source other than a host, as shown in block 310. In various embodiments, the source can be, by way of illustration and not by way of limitation, a network 102 as described with regard to FIG. 1. In some embodiments, accessing the data from a source other than the host can include accessing the data in a mobile system, where the mobile system can be selected from a group that includes: a digital camera; a digital music device; a network device; a mobile telephone; a personal digital assistant device; and a laptop computer; among a number of other possible mobile systems.

An atomic operation is intended to be performed as described elsewhere herein. In some embodiments, accessing the defined set of data in the atomic operation manner can include using a pointer to a last known-good version of such data until initial access to the defined set of data is complete.

As shown in block 320, the embodiment includes storing the defined set of data in the system as the single object to a number of solid state memory blocks as formatted by a control component of a solid state device that includes the number of solid state memory blocks. In some embodiments, the storing can be performed once the atomic operation is completed. Storing the defined set of data to the number of memory blocks can, in some embodiments, include storing multiple copies of the defined set of data each to separate memory blocks after independently performing an atomic operation on each of the multiple copies is complete.

The solid state device can, in some embodiments, provide a host with a previously stored version of the defined set of data upon detecting multiple read requests to a newly stored version of the defined set of data during a particular period of time. For example, in various embodiments, the solid state device or the host can detect multiple read requests to a newly stored boot image required for a booting operation in the system. Consequently, in some embodiments, the solid state device can provide the host with a last known-good version of a boot image.

In accordance with the teachings of the present disclosure, object oriented memory can, in various embodiments, include accessing a defined set of data as a single object, where the accessing is from a source other than the host, and performing a read-verify operation on the accessed defined set of data. Embodiments of particular read-verify operations are described in more detail below. The embodiment can include storing the defined set of data as the single object in a number of memory blocks as formatted by a control component operably coupled to a solid state device that includes the number of solid state memory blocks.

In some embodiments, the storing of the defined set of data as the single object is performed once the read-verify operation is completed. Performing the read-verify operation on the accessed data can, in some embodiments, include using a pointer to a last known-good version of a previously stored defined set of the data until the read-verify operation on the accessed defined set of new data is completed and the storing of the defined set of new data is completed.

When the solid state device has determined that an object was reliably written and verified, the solid state device can send a write completion acknowledgement to the host. Any reads after the acknowledgement is sent to the host would be made on the new object rather than on the previous known-good object. Alternatively, the host can require controlling the transition through a command, a register setting, or similar notification to the solid state device before allowing the transition to occur.

The read-verify operation can, in some embodiments, be independently performed on multiple copies of the defined set of new data before a write operation on each of the copies is performed, and subsequently storing copies of the defined set of new data in which the read-verify operation detected fewer than a particular number of errors. Some embodiments can include storing multiple copies of the defined set of new data once the read-verify operation is successfully completed. Some embodiments can include providing automatic fail-over to a read-verified copy of the data when at least the particular number of errors is detected in another of the multiple copies of the defined set of new data. In particular, some embodiments can include providing automatic fail-over to a read-verified copy of the defined set of new data when a particular number of new errors are detected in another previously read-verified and stored copy of the defined set of new data. Embodiments of performing the read-verify operation can include performing a cyclic redundancy checking (CRC) operation. Embodiments of read-verify operations are not so limited.

Error detection operations can have the ability to detect the presence of errors caused by noise or other impairments during transmission from a transmitter to a receiver. Error correction can have the additional ability to reconstruct the original, error-free data. Briefly, examples of such, not by way of limitation, can include an automatic repeat-request (ARQ) in which the transmitter sends the data and also an error detection code, which the receiver can use to check for errors, and request retransmission of erroneous data. In some cases, the request is implicit in that the receiver sends an acknowledgement (ACK) of correctly received data, and the transmitter resends anything not acknowledged within a reasonable period of time.

Another example is forward error correction (FEC) in which the transmitter encodes the data with an error-correcting code (ECC) and sends the coded message. The receiver might not send any messages back to the transmitter. The receiver can decode what it receives into the "most likely" data. The codes are designed so that it would take a large amount of noise to trick the receiver into misinterpreting the data. It is possible to combine the two, so that minor errors are corrected without retransmission, and major errors are detected and a retransmission is requested.

Some embodiments of the present disclosure can include performing an error correction operation when a particular number of errors are detected in at least one of a number of previously read-verified and stored copies of the defined set of data. Some embodiments perform the error correction operation when a particular number of errors are detected in at least one of a number of copies not-yet read-verified or stored copies of the defined set of data. Performing the error correction operation can, in some embodiments, include performing a bit-by-bit comparison of multiple previously read-verified and stored copies of the defined set of data, where the solid state device validates one or more copies from among the multiple copies by selecting from a majority of matching copies.

Other protections can include calculation of an arithmetic signature of the defined data set (e.g., a hash function, as appreciated by one of ordinary skill in the art). The solid state device can calculate, for example, the hash function and then present the calculation back to the host as part of the completion acknowledgement response. The host can then make a decision whether the signature is correct. Reading the object can also generate a data signature (e.g., a hash function) that the host can use as part of an authentication program. The signature can either be calculated prior to sending the object data to the host or as the object data is being sent and the signature would thus be available for the host to read from the solid state device.

Briefly, a hash function is a well-defined procedure or mathematical function that converts a large, possibly variable-sized amount of data into a small datum, usually a single integer that may serve as an index into an array. Hash functions are mostly used to speed up table lookup or data comparison tasks. Hash functions are related to checksums, check digits, fingerprints, randomizing functions, error correcting codes, and cryptographic hash functions. Although these concepts overlap to some extent, each has its own uses and requirements and all are within the scope of the present disclosure.

Having the device calculate the arithmetic signature (e.g., automatically on power-up) can be used to authenticate the data before execution of the encoded data. Such authentication can improve the overall security of the system, for example, by preventing hackers from modifying the code to gain access to a network and/or other operations.

Some embodiments of the present disclosure can include providing an arithmetic signature in the defined set of data prior to accessing the data from the source, where the arithmetic signature is provided by the solid state device back to the source for detection of errors. In addition or in the alternative, some embodiments can include providing an arithmetic signature in the defined set of data prior to accessing the data from the host, where the arithmetic signature is provided by the solid state device back to the host for detection of errors.

The solid state device can calculate, for example, the hash function and then present the calculation back to the host as part of the completion acknowledgement response. The host can then make a decision whether the signature is correct. Reading the object can also generate a data signature (e.g., a hash function) that the host can use as part of an authentication program. The signature can either be calculated prior to sending the object data to the host, or as the object data is being sent, and the signature would thus be available for the host to read from the solid state device.

CONCLUSION

The present disclosure includes methods, devices, and systems for object oriented memory in solid state devices. One embodiment of a method for object oriented memory in solid state devices includes accessing a defined set of data as a single object in an atomic operation manner, where the accessing is from a source other than a host. The embodiment also includes storing the defined set of data as the single object in a number of solid state memory blocks as formatted by a control component of a solid state device that includes the number of solid state memory blocks.

It will be understood that when an element is referred to as being "on," "connected to" or "coupled with" another element, it can be directly on, connected, or coupled with the other element or intervening elements may be present. In contrast, when an element is referred to as being "directly on," "directly connected to" or "directly coupled with" another element, there are no intervening elements or layers present. It will be understood that when a first element is referred to as being "connected to" or "coupled with" another element, the first element is physically attached to the other of the two elements is intended. In contrast, when elements are referred to as being "operably coupled," the elements are in communication with one another. As used herein, when it is stated that a solid state control component can perform an action, it will be understood as an abbreviated substitute for "the control component that is configured to" or "the control component that is configured to execute by way of a processor". As used herein, the term "or" by itself is inclusive of the plurality of linked elements, rather than being used in an exclusive manner, unless explicitly stated otherwise. Further, as used herein, the term "and/or" includes any and all combinations of one or more of the associated listed items.

It will be understood that, although the terms first, second, etc. may be used herein to describe various elements and that these elements should not be limited by these terms. These terms are only used to distinguish one element from another element. Thus, a first element could be termed a second element without departing from the teachings of the present disclosure.

In the detailed description of the present disclosure, reference is made to the accompanying drawings that form a part hereof, and in which is shown by way of illustration how one or more embodiments of the present disclosure may be practiced. These embodiments are described in sufficient detail to enable those of ordinary skill in the art to practice the embodiments of this disclosure, and it is to be understood that other embodiments may be utilized and that process, electrical, or structural changes may be made without departing from the scope of the present disclosure.

As will be appreciated, elements shown in the various embodiments herein can be added, exchanged, or eliminated so as to provide a number of additional embodiments of the present disclosure. In addition, as will be appreciated, the proportion and the relative scale of the elements provided in the figures are intended to illustrate the embodiments of the present disclosure, and should not be taken in a limiting sense.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises" and "comprising," as used in this specification, specify the presence of stated features, integers, steps, operations, elements, or components, but do not preclude the presence or addition of one or more other features, integers, steps, operations, elements, components, or groups thereof.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and should not be interpreted in an idealized or overly formal sense unless expressly so defined herein.

Although specific embodiments have been illustrated and described herein, those of ordinary skill in the relevant art will appreciate that an arrangement calculated to achieve the same results can be substituted for the specific embodiments shown. This disclosure is intended to cover all adaptations or variations of various embodiments of the present disclosure.

It is to be further understood that the above description has been made in an illustrative fashion, and not a restrictive one. Combination of the above embodiments, and other embodiments not specifically described herein, will be apparent to those of ordinary skill in the relevant art upon reviewing the above description.

The applicability of the various embodiments of the present disclosure includes other applications in which the above methods, devices, and systems are used, for example, in association with other computing systems, mobile devices and/or systems, and the like. Therefore, the applicability of various embodiments of the present disclosure should be determined with reference to the appended claims, along with the full range of equivalents to which such claims are entitled.

In the foregoing Detailed Description, various features are grouped together in a single embodiment for the purpose of streamlining the disclosure. This method of disclosure is not to be interpreted as reflecting an intention that the disclosed embodiments of the present disclosure need to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. A method of object oriented memory in solid state devices, comprising:
    accessing a defined set of data as a single object in an atomic operation manner, wherein the accessing is from a source other than a host;
    storing, after the accessing of the defined set of data from the source other than the host, the defined set of data as the single object in a number of solid state memory blocks as formatted by a control component of a solid state device that includes the number of solid state memory blocks; and
    providing the host with a previously stored version of the defined set of data upon detecting multiple read requests to a newly stored version of the defined set of data during a particular period of time.

2. The method of claim 1, wherein the storing is performed once the atomic operation manner is completed.

3. The method of claim 1, wherein accessing the defined set of data in the atomic operation manner includes using a pointer to a last known-good version of such data until initial access to the defined set of data is complete.

4. The method of claim 1, wherein storing the defined set of data to the number of memory blocks includes writing multiple copies of the defined set of data, each copy in separate memory blocks after independently performing an atomic operation on each of the multiple copies is complete.

5. The method of claim 1, wherein detecting multiple read requests to the newly stored version of the defined set of data includes either the solid state device or the host detecting multiple read requests to a newly stored boot image required for a booting operation in a system managed by the host.

6. The method of claim 5, wherein detecting multiple read requests to the newly stored boot image includes the solid state device providing the host with a last known-good version of a boot image.

7. The method of claim 1, wherein accessing data includes accessing the data in a mobile system selected from a group including:
    a digital camera;
    a digital music device;
    a network device;
    a mobile telephone;
    a personal digital assistant device; and
    a laptop computer.

8. A method of object oriented memory in solid state devices, comprising:
- accessing a defined set of data as a single object, wherein the accessing is from a source other than a host;
- performing a read-verify operation on the accessed defined set of data; and
- storing, after the accessing of the defined set of data from the source other than the host and performing the read-verify operation, the defined set of data as the single object in a number of memory blocks as formatted by a control component operably coupled to a solid state device that includes the number of solid state memory blocks; and
- independently performing the read-verify operation on multiple copies of the defined set of new data before a write operation on each of the copies is performed and subsequently storing copies of the defined set of new data in which the read-verify operation detected fewer than a particular number of errors.

9. The method of claim 8, wherein the storing of the defined set of data as the single object is performed once the read-verify operation is completed.

10. The method of claim 8, wherein performing the read-verify operation on the accessed data includes using a pointer to a last known-good version of a previously stored defined set of the data until the read-verify operation on the accessed defined set of new data is completed and the storing of the defined set of new data is completed.

11. The method of claim 8, wherein the method includes storing multiple copies of the defined set of new data once the read-verify operation is successfully completed.

12. The method of claim 11, wherein the method includes providing automatic fail-over to a read-verified copy of the data when at least the particular number of errors is detected in another of the multiple copies of the defined set of new data.

13. The method of claim 11, wherein the method includes providing automatic fail-over to a read-verified copy of the defined set of new data when at least a particular number of new errors are detected in another previously read-verified and stored copy of the defined set of new data.

14. The method of claim 8, wherein performing the read-verify operation includes performing a cyclic redundancy checking operation.

15. The method of claim 8, wherein the method includes performing an error correction operation when a particular number of errors are detected in at least one of a number of previously read-verified and stored copies of the defined set of data.

16. The method of claim 15, wherein performing the error correction operation includes performing a bit-by-bit comparison of multiple previously read-verified and stored copies of the defined set of data, wherein the solid state device validates one or more copies from among the multiple copies by selecting from a majority of matching copies.

17. The method of claim 8, wherein the method includes providing an arithmetic signature in the defined set of data prior to accessing the data from the source, wherein the arithmetic signature is provided by the solid state device back to the source for detection of errors.

18. The method of claim 8, wherein the method includes providing an arithmetic signature in a defined set of data prior to accessing the data from the host, wherein the arithmetic signature is provided by the solid state device back to the host for detection of errors.

19. A solid state device, comprising:
- a control component coupled to a number of solid state memory arrays in the solid state device, wherein each array has multiple physical blocks of memory cells and wherein the control component is configured to:
  - access a defined set of data as a single object from a source other than a host;
  - perform a read-verify operation on the accessed defined set of data;
  - store, after the access of the defined set of data from the source other than the host and the read-verify operation, the defined set of data in the number of arrays as the single object beginning-to-end in a number of contiguous physical blocks of memory cells;
  - perform an error correction operation that includes a bit-by-bit comparison of multiple previously read-verified and stored copies of the defined set of data; and
  - validate one or more copies from among the multiple copies by selecting from a majority of matching copies.

20. The device of claim 19, wherein the control component includes an associated processor that manages formatting of the single object in the physical blocks of memory cells in the number of arrays.

21. The device of claim 19, wherein the multiple physical blocks of memory cells are arranged in a non-volatile NAND or a non-volatile NOR architecture.

22. The device of claim 19, wherein the defined set of data is for a boot image or an operating system.

23. The device of claim 19, wherein the control component is configured to store the defined set of data in a particular partition of the number of memory arrays of the physical blocks of memory cells.

24. The device of claim 19, wherein the control component is configured to access the defined set of data and store the defined set of data in the number of arrays after completion of an atomic operation.

25. The device of claim 24, wherein the control component is configured to assign a pointer to a last known-good copy of the data in the arrays until completion of the atomic operation, wherein the pointer directs a read of the data to be performed on the last known-good copy.

26. A solid state device, comprising:
- a control component coupled to one or more solid state memory arrays in the solid state device, wherein each of the one or more arrays has multiple physical blocks of memory cells and wherein the control component is configured to:
  - access a defined set of data as a single object from a source other than a host, wherein one or more iterations of the defined set of data are accessed;
  - store, after the access of the defined set of data from the source other than the host, multiple copies of the one or more iterations to particular locations in the number of arrays as the single object after independent verification of the multiple copies of the one or more data iterations; and
  - read and independently correct a number of errors found prior to storing the single object in the array.

27. The device of claim 26, wherein the control component is configured to store each of the multiple copies in physically different arrays of the one or more arrays.

28. The device of claim 26, wherein the control component is coupled to only one array.

29. The device of claim 26, wherein the control component is configured to store at least one of the multiple copies in physical blocks of the array determined to be more reliable than other physical blocks.

30. The device of claim 29, wherein the physical blocks of the array determined to be more reliable are physical blocks having single-level memory cells.

31. The device of claim 29, wherein the physical blocks of the array determined to be more reliable are physical blocks having memory cells that have been reused fewer times than memory cells of the other physical blocks.

32. The device of claim 26, wherein the control component is configured to assign a pointer to a particular copy of the one or more data iterations as a new last known-good copy to replace a previous last known-good copy.

33. The device of claim 32, wherein the control component is configured to send a store completion acknowledgment to a host such that any read by the host is directed by the pointer to the new last known-good copy.

34. The device of claim 32, wherein the control component is configured to send a store completion acknowledgement response to a host that is delayed until a data protection operation is successfully completed.

35. The device of claim 26, wherein the control component is configured to read the single object, beginning-to-end, in a number of contiguous physical blocks of memory cells.

36. The device of claim 26, wherein the control component is configured to automatically initiate a read operation based upon a power-on reset, a transition of a signal, or both, and the read data is automatically sent to a host where it is either used to boot the host or the data is ignored if the data is not required by the host at that time.

37. The device of claim 26, wherein the control component is configured to save a new defined set of data as a last install wherein the last install is defined as a known-good copy after the new defined set of data has booted successfully at least once as stored.

38. A system, comprising:
a host control component that includes instructions stored on a non-transitory medium and that is configured to be operably coupled to a host in order to manage a system;
wherein the host control component is configured to independently perform a read-verify operation on multiple copies of a defined set of new data before a write operation on each of the copies is performed and subsequently store copies of the defined set of new data in which the read-verify operation detected fewer than a particular number of errors;
wherein the host control component is configured to be operably coupled to a control component of a solid state device having multiple solid state physical memory blocks of memory cells; and
wherein the control component of the solid state device is configured to access the defined set of data as a single object from a source other than a host and manage the accessed defined set of data as the single object during subsequent write and read operations.

39. The system of claim 38, wherein the control component of the solid state device is configured to store multiple copies of the single object and wherein each of the multiple copies is separately stored in the multiple memory blocks as determined by a set of rules for writing to physically separate memory blocks.

40. The system of claim 39, wherein the control component of the solid state device is configured to store the multiple copies of the single object in a particular partition of the multiple physical memory blocks of memory cells.

41. The system of claim 40, wherein the control component of the solid state device is configured to store each of the multiple copies of the single object in the particular partition contiguously in a number of the multiple physical memory blocks for end-to-end data integrity.

42. The system of claim 40, wherein the control component of the solid state device is configured to store data in the multiple physical memory blocks as determined by logical block addressing.

43. The system of claim 42, wherein the control component of the solid state device is configured to store data in particular logical block addresses.

44. A system, comprising:
a host control component that includes instructions stored on a non-transitory medium and that is configured to be operably coupled to a host in order to manage a system;
wherein the host control component is configured to be operably coupled to a control component of a solid state device having multiple solid state physical memory blocks of memory cells;
wherein the control component of the solid state device is configured to access a defined set of data in a block oriented manner from a source other than a host and manage the accessed defined set of data in the block oriented manner during subsequent write, store, and read operations;
wherein a set of rules is followed by the host control component and the solid state device control component to subsequently store the accessed defined set of data in a defined series of particular logical block addresses in a particular order;
wherein a write of the defined set of data includes the host control component providing an indicator to the solid state device control component to identify a last block of the defined set of data; and
wherein the solid state device control component is configured to read the defined set of data consecutively from a beginning to an end of the particular order of the defined set of data as if the defined set of data was stored in an object oriented manner.

45. The system of claim 44, wherein the set of rules followed by the host control component and the solid state device control component allows a write of the defined set of data in separate and non-partitioned physical memory blocks in the multiple solid state device physical memory blocks.

46. The system of claim 44, wherein the set of rules followed by the host control component and the solid state device control component includes a particular series of physical memory block numbers to write the defined set of data.

47. The system of claim 46, wherein the write of the defined set of data is performed in a particular order.

48. The system of claim 44, wherein the solid state device control component is configured to store multiple copies of the defined set of data and wherein each of the multiple copies is separately stored to the multiple memory blocks as determined by the set of rules.

49. The system of claim 48, wherein the solid state device control component is configured to manage the multiple copies of the defined set of data by providing the host control component read access to a last known-good copy of the defined set of data.

50. A method of object oriented memory in solid state devices, comprising:
accessing a defined set of data as a single object, wherein the accessing is from a source other than a host;

performing a read-verify operation on multiple copies of the accessed defined set of data prior to storing the single object in a number of memory blocks;

storing, after the accessing of the defined set of data from the source other than the host and performing the read-verify operation, multiple copies of the defined set of data as the single object in the number of memory blocks as formatted by a control component operably coupled to a solid state device that includes the number of solid state memory blocks.

51. A solid state device, comprising:

a control component coupled to one or more solid state memory arrays in the solid state device, wherein each of the one or more arrays has multiple physical blocks of memory cells and wherein the control component is configured to:

access a defined set of data as a single object from a source other than a host, wherein one or more iterations of the defined set of data are accessed;

independently verify, after the one or more iterations of the accessed data are accessed, multiple copies of the one or more data iterations prior to storing the single object in the number of arrays;

store, after the access of the defined set of data from the source other than the host, multiple copies of the one or more iterations to particular locations in the number of arrays as the single object.

52. A solid state device, comprising:

a control component coupled to one or more solid state memory arrays in the solid state device, wherein each of the one or more arrays has multiple physical blocks of memory cells and wherein the control component is configured to:

access a defined set of data as a single object from a source other than a host, wherein one or more iterations of the defined set of data are accessed;

independently verify, after the one or more iterations of the accessed data are accessed, multiple copies of the one or more data iterations prior to storing the single object in the one or more solid state memory arrays;

store, after the access of the defined set of data from the source other than the host, the multiple copies of the one or more iterations to particular locations in the number of arrays as the single object; and save a new defined set of data as a last install and the last install will be defined as a known-good copy after the new defined set of data has booted successfully at least once as stored.

53. A solid state device, comprising:

a control component coupled to a number of solid state memory arrays in the solid state device, wherein each array has multiple physical blocks of memory cells and wherein the control component is configured to:

access a defined set of data as a single object from a source other than a host;

performing a read-verify operation on the accessed defined set of data;

store, after the access of the defined set of data from the source other than the host and the read-verify operation, the defined set of data in the number of arrays as the single object after completion of an atomic operation;

assign a pointer to a last known-good copy of the data in the arrays until completion of the atomic operation, wherein the pointer directs a read of the data to be performed on the last known-good copy;

perform an error correction operation that includes a bit-by-bit comparison of multiple previously read-verified and stored copies of the defined set of data; and validate one or more copies from among the multiple copies by selecting from a majority of matching copies.

* * * * *

UNITED STATES PATENT AND TRADEMARK OFFICE
CERTIFICATE OF CORRECTION

| | | |
|---|---|---|
| PATENT NO. | : 8,751,860 B2 | Page 1 of 1 |
| APPLICATION NO. | : 12/477349 | |
| DATED | : June 10, 2014 | |
| INVENTOR(S) | : Peter Feeley et al. | |

It is certified that error appears in the above-identified patent and that said Letters Patent is hereby corrected as shown below:

In the Claims:

In column 24, line 19, in Claim 53, delete "performing" and insert -- perform --, therefor.

Signed and Sealed this
Twenty-sixth Day of August, 2014

Michelle K. Lee
*Deputy Director of the United States Patent and Trademark Office*